(12) United States Patent
Mutoh

(10) Patent No.: US 7,145,217 B2
(45) Date of Patent: Dec. 5, 2006

(54) CHIP-TYPE NOISE FILTER, MANUFACTURING METHOD THEREOF, AND SEMICONDUCTOR PACKAGE

(75) Inventor: Toshiaki Mutoh, Sendai (JP)

(73) Assignee: Kyocera Corporation, Kyoto (JP)

( * ) Notice: Subject to any disclaimer, the term of this patent is extended or adjusted under 35 U.S.C. 154(b) by 113 days.

(21) Appl. No.: 11/042,523

(22) Filed: Jan. 25, 2005

(65) Prior Publication Data
US 2006/0163693 A1    Jul. 27, 2006

(51) Int. Cl.
*H01L 29/00* (2006.01)
(52) U.S. Cl. ................... 257/531; 257/532
(58) Field of Classification Search ............ 257/528, 257/531, 379, 277, 516, 532; 333/181, 185
See application file for complete search history.

(56) References Cited

U.S. PATENT DOCUMENTS

| | | | | |
|---|---|---|---|---|
| 5,220,298 A | * | 6/1993 | Nagase | 333/185 |
| 5,453,242 A | * | 9/1995 | Knoess | 419/27 |
| 6,483,413 B1 | * | 11/2002 | Maeda et al. | 336/200 |
| 2002/0017628 A1 | * | 2/2002 | Akimoto et al. | 252/62.56 |

FOREIGN PATENT DOCUMENTS

| | | |
|---|---|---|
| JP | 2000-021640 | 1/2000 |
| JP | 2002-171104 | 6/2002 |

OTHER PUBLICATIONS

Sung, Hsiao-Miin; Chen, Chi-Jen; Wang, Lih-Jiun; Ko, Wen-Song; The Characteristics of Low Temperature Co-Fired Multilayer Chip LC Filters; Jul. 1998; IEEE Transactions on Magnetics, vol. 34, No. 4, pp. 1363-1365.*

* cited by examiner

*Primary Examiner*—Minh-Loan Tran
(74) *Attorney, Agent, or Firm*—Hogan & Hartson LLP

(57) ABSTRACT

In a chip-type noise filter having a signal line of a conductor and a magnetic body disposed so as to adhere to the signal line, the magnetic body is a sintered body containing mainly $Fe_2O_3$ and containing NiO in the rest. This enables to effectively absorb and damp noise of quasi-millimeter wave and millimeter wave, and even if used at the inside of semiconductor package, no outgassing occurs at the time of temperature rise in the assembly process and operating conditions thereof, thereby permitting improvement of the characteristics of the semiconductor package, along with high reliability.

6 Claims, 2 Drawing Sheets

CHIP-TYPE NOISE FILTER, MANUFACTURING METHOD THEREOF, AND SEMICONDUCTOR PACKAGE

BACKGROUND OF THE INVENTION

1. Field of the Invention

The present invention relates to a chip-type noise filter for eliminating high-frequency noise entering a signal line of electronic equipment, a manufacturing method thereof, and a semiconductor package using the chip-type noise filter.

2. Description of Related Art

In the recent years, to meet a market need for high-speed and large-scale information communication by optical communication and radio communication, the trend in the operating frequency and signal frequency of electronic equipment used for these communications is toward higher speeds from year to year.

In particular, the frequency of electric signals of electronic equipment used for high-speed optical communication and radio communication becomes high-speed up to a frequency band of not less than 10 GHz, which is called quasi-millimeter wave and millimeter wave. The problem of noise becomes pronounced as a problem common to equipment handling such frequencies.

When the frequency of an electric signal reaches the regions of quasi-millimeter wave and millimeter wave, it can be considered that an electric signal passing through a signal line is handled as an electromagnetic wave, and the electromagnetic wave propagates along the signal line thereby to transfer the electric signal.

Such an electric signal as an electromagnetic wave is susceptible to radiation into space at, for example, discontinuous surfaces, bent portions, etc. of a signal line, and in some cases, it may cause radiation noise.

This radiation noise is reflected in multiple at the inside of the casing of electronic equipment, and then enters other signal line as noise, thus causing the problem of noise, which is termed "crosstalk."

As a component for eliminating so-called conduction noise so entered into a signal line, there has been manufactured a small chip-type noise filter, which is used by soldering on a substrate.

This type of filter configures an equivalent circuit consisting of parts L1, L2 and C, as shown in FIG. 4, and functions as a so-called low-pass filter, which cuts high frequencies and passes low frequencies.

A conventional chip-type noise filter employs ceramics as a dielectric, and it is manufactured in the following manner that: after forming a ceramics green sheet having a predetermined thickness, a circuit member and an electrode member are arranged thereon by screen printing or the like, and as required, a plurality of the green sheets are laminated and adhered to each other, followed by firing for integration (Japanese unexamined Patent Publication No. 2000-21640).

As a noise filter usable in a high-frequency band including quasi-millimeter wave and millimeter wave, there is disclosed a chip-type noise filter having a signal line consisting of a conductor in the state of being adhered to the surface of a composite material in which soft magnetic material powder is dispersed and mixed in a matrix such as rubber or plastic (Japanese unexamined Patent Publication No. 2002-171104).

However, the frequency of noise, which can be eliminated by the filter as disclosed in Japanese unexamined Patent Publication No. 2000-21640, is approximately 3 GHz in maximum, thus failing to eliminate noise of quasi-millimeter wave and millimeter. In addition, the manufacturing method thereof is expensive in processing cost, and there is a problem in reducing the cost of parts.

On the other hand, the filter as disclosed in Japanese unexamined Patent Publication No. 2002-171104 can eliminate the noise of quasi-millimeter wave and millimeter wave. However, since rubber or plastic etc. is used as a matrix, there is the problem that, depending on the manufacturing conditions and operating conditions of electronic equipment, outgassing occurs at the time of temperature rise, thereby to corrode an electric circuit and a signal line in the surroundings, and also cause deterioration of characteristics.

In particular, the application of this filter to portions for which high airtight is required, such as the inside of a semiconductor package, suffers from the following problem. At the time of temperature rise in the manufacturing step of the semiconductor package and under operating environment, outgassing occurs to deteriorate the characteristics of a semiconductor device and corrode a peripheral signal line, thus deteriorating transmission characteristics.

SUMMARY OF THE INVENTION

According to the present invention, in a chip-type noise filter having a signal line of a conductor and a magnetic body disposed so as to adhere to the signal line, the magnetic body comprises a sintered body containing $Fe_2O_3$ as main component and containing NiO in the rest.

In a chip-type noise filter of the present invention, the magnetic body has a $Fe_2O_3$ content of 70 to 95 mol %.

A method of manufacturing a chip-type noise filter of the present invention includes: the step of preparing a magnetic body containing $Fe_2O_3$ as main component and containing NiO in the rest; and the step of forming at the magnetic body a signal line of a conductor; and the step of dividing the magnetic body in a predetermined individual chip dimension.

A semiconductor package of the present invention includes disposing the chip-type noise filter in an inner space in which a semiconductor device is sealed air-tight.

In accordance with the present invention, in the chip-type noise filter having a signal line of a conductor, and a magnetic body disposed so as to adhere to the signal line, the magnetic body is a sintered body containing $Fe_2O_3$ as main component and containing NiO in the rest. This enables to effectively absorb and damp noise of quasi-millimeter wave and millimeter wave, and in addition, if used at the inside of a semiconductor package, no outgassing occurs at the time of temperature rise due to the assembly process and operating conditions thereof. It is therefore able to improve the characteristics of the semiconductor package, along with high reliability.

DESCRIPTION OF PREFERRED EMBODIMENTS

Preferred embodiments of the present invention relating to a chip-type noise filter and a semiconductor package using the same will be described below.

Figure 1A:
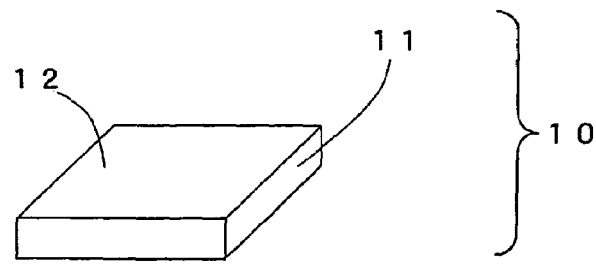
FIGS. 1A and 1B are perspective views, each illustrating a chip-type noise filter of the present invention.
Figure 1B:
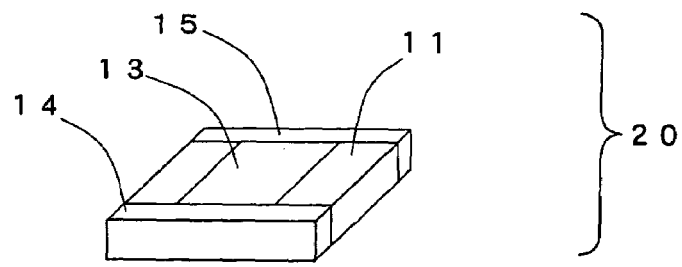

FIGS. 1A and 1B are perspective views, each illustrating one embodiment of the chip-type noise filter of the present invention.

Specifically, FIG. 1A illustrates a chip-type noise filter 10, in which a signal line 12 is formed on the entire of one surface so as to adhere to the surface of a flat magnetic body 11. FIG. 1B illustrates a chip-type noise filter 20, in which a signal line 13 having a small area is formed, and terminal electrodes 14 and 15 for connecting to an external circuit are formed at both ends of the signal line 13. In the figures, similar reference numerals indicate like parts.

Both figures show a basic shape of the chip-type noise filter having the signal line 12 or 13 on the surface of the magnetic body 11.

The magnetic body 11 is made of a magnetic material and hence has the effect of absorbing and damping electric signals of high frequency, and the signal line 12 or 13 is formed on the magnetic body 11, thus enabling to effectively absorb noise composition of high frequency passing through the signal line 12 or 13.

It is also important that the magnetic body 11 is a sintered body containing mainly $Fe_2O_3$ and containing NiO in the rest.

By forming the magnetic body 11 with a sintered body containing mainly $Fe_2O_3$ and containing NiO in the rest, the chip-type noise filter has excellent noise absorbability to electromagnetic waves of quasi-millimeter wave and millimeter wave, and also has excellent heat resistance because of the sintered body. Therefore, when connecting respective parts by heat treatment, decomposition, deformation, and deterioration of strength can be minimized to eliminate the occurrence of degassing.

In addition, it is important that the $Fe_2O_3$ content of the magnetic body 11 is preferably 50 to 95 mol %, more preferably 70 to 95 mol %.

The reason for this is as follows. When the $Fe_2O_3$ content is less than 50 mol %, it is difficult to obtain sufficient noise absorbability in quasi-millimeter wave and millimeter wave, thus failing to completely eliminate noise of these frequencies. When the $Fe_2O_3$ content is not less than 50 mol % and less than 70 mol %, noise absorbability in quasi-millimeter wave and millimeter wave is excellent, however, the change of noise absorbability remains due to a slight change of $Fe_2O_3$ content, thus making difficult to design the chip-type noise filter 20.

On the other hand, the reason why the $Fe_2O_3$ content is not more than 95 mol % is that, when it is over 95 mol %, sintering becomes difficult depending on the pressure at the time of forming, thus failing to obtain excellent noise absorbability, and lowering yield.

The reason for containing NiO in the rest is that in the absence of NiO, volume specific resistance value of the magnetic body 11 is raised thereby to make impossible to obtain excellent noise absorbability, and make difficult to sinter at low temperatures.

Relating to the crystal grain size of the magnetic body 11, its average value is preferably in the range of 1.0 to 100 μm, more preferably in the range of 1.0 to 20 μm. When the crystal grain size is beyond the above-mentioned range, the strength of the magnetic body 11 is lowered, so that cracks occur at the time of processing and packaging, and excellent noise absorbability cannot be obtained.

The porosity of the magnetic body 11 is preferably not more than 1.0%. When it is over 1.0%, the flatness of the signal lines 12 and 13 is impaired to deteriorate solder wettability and wire bonding characteristic at the time of mounting. It is also difficult to clean grinding water and wax etc. which are used in the manufacturing step of the chip-type noise filter 20.

Relating to the material of the signal lines 12 and 13, in consideration of electrical resistance and adhesion with magnetic material, it is preferable to use metal such as Au, Ag, Pt, Ti, Al, Sn, Zn, Pd, Cu, Ni, and Fe, and alloy containing these. The signal lines 12 and 13 may be composed of one or more layers.

The magnetic body 11 of the present invention is manufactured by the following method.

First, raw material powder having not less than 50 mol % of $Fe_2O_3$ and raw material powder of NiO, together with water, are put in a ball mill or a beads mill, followed by wet type mixing for 6 to 10 hours, thereby obtaining a slurry having a predetermined viscosity.

Herein, when the raw material powder of $Fe_2O_3$ and the raw material powder of NiO are put in a ball mill or a beads mill, no problem may arise if known curing agent, curing aid, plasticizer, dispersing agent, mold releasing agent, coloring agent, and extender (inorganic material) are added in a small amount within the scope of the present invention.

To assure sinterability, it is preferable to use raw material powder of $Fe_2O_3$ and raw material powder of NiO, which have a mean grain size of 1 μm or more, preferably 0.85 μm or more.

Additionally, from the viewpoint of enabling forming at a lower pressure, it is preferable to add at least one type of raw material powder selected from ZnO, CuO and $Bi_2O_3$. It is particularly suitable that the sum of addition thereof is 5 to 10 mol %. By so doing, the cost of an apparatus used in the forming process can be reduced, and the magnetic body 11 having a complicated shape can also be manufactured.

Subsequently, the above-mentioned slurry is dried and granulated with a spray drying. The obtained granulated powder is formed by predetermined forming means, such as powder pressing method, to obtain a green body having an arbitrary shape.

In other alternative, after drying the above-mentioned slurry, this may be calcined at about 700 to 900° C., and ground with a ball mill or a beads mill etc. After drying again with the spray dryer, a green body having an arbitrary shape is produced by predetermined forming means, such as powder pressing method.

Herein, when employing powder pressing method, its forming pressure may be 100 to 300 MPa, for example.

Next, the above green body is fired at 1000 to 1400° C. with a holding time of 0 to 2 hours, and the temperature is lowered under 300 to 500° C./hour, thus obtaining the magnetic body 11 of the present invention.

On the surface of the magnetic body 11 so obtained, a film of Ni as an underlayer, and a film of Au as a surface protecting layer are formed by vacuum deposition, for example, to obtain the signal line 12, and then cut in a predetermined chip size with a dicing machine, resulting in the chip-type noise filter 10 of the present invention.

On the other hand, the chip-type noise filter 20 may be manufactured, for example, in the following manner that, instead of the signal line 12 of the chip-type noise filter 10, the signal line 13 is formed and cut in a predetermined chip size, thereafter, the terminal electrodes 14 and 15 composed of Mo—Mn alloy etc. are formed by dipping into an electrode paste, followed by printing at a predetermined temperature. As required, plating of Ni, and further Au, etc. may be applied by electrolytic deposition, or the like.

While in FIG. 1B, the terminal electrodes 14 and 15 are illustrated in such a shape as to extend to the entire surface of both ends of the magnetic body 11, without limiting to this shape, they may be formed at part of both ends or only on the surface of the magnetic body 11.

When cutting in the above-mentioned chip size, V-grooves for dividing in an individual piece may be formed in advance, and the signal line 12 or 13 is formed by thin-film method or thick-film printing method, etc., and then divided along the V-grooves in the individual piece.

Figure 2A:
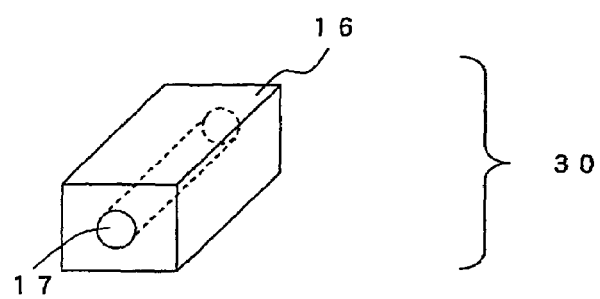
FIGS. 2A and 2B are perspective views, each illustrating other preferred embodiment of the chip-type noise filter of the present invention.
Figure 2B:
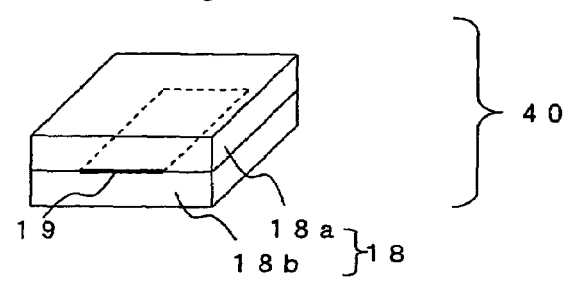

FIGS. 2A and 2B illustrate, in perspective view, examples of other preferred embodiments of the chip-type noise filter of the present invention, respectively.

Specifically, FIG. 2A illustrates a chip-type noise filter 30, in which a signal line 17 is formed so as to pass through the inside of a prismatic magnetic body 16; and FIG. 2B illustrates a chip-type noise filter 40, in which, with a flat conductor as a signal line 19, magnetic bodies 18 (18a, 18b) are adhered to the signal line 19 so as to sandwich vertically.

Since in these chip-type noise filters 30 and 40, the magnetic bodies 16 and 18 are formed so as to surround the signal lines 17 and 19, respectively, noise passing through the signal lines 17 and 19 can be absorbed into the magnetic bodies 16 and 18 more effectively than the chip-type noise filters 10 and 20 in FIGS. 1A and 1B, respectively.

Like the foregoing magnetic body 11, it is also important in these magnetic bodies 16 and 18 that they consists of a sintered body containing mainly $Fe_2O_3$ and containing NiO in the rest.

The magnetic body 16 may be manufactured in the same manner as in the foregoing magnetic body 11. That is, by general powder pressing method of ceramics, etc, a prismatic green body having at the center a through-hole is obtained and fired at 1000 to 1400° C. with a holding time of 0 to 2 hours, and the temperature is lowered under 300 to 500° C./hour. Subsequently, a conductor serving as the signal line 17 is inserted and connected, alternatively, after filling a paste-like conductor, heat treatment is conducted to form the signal line 17, resulting in the chip-type noise filter 30.

In other alternative, the chip-type noise filter 40 or the like may be manufactured in the following manner that, with a sheet-like conductor as the signal line 19, the magnetic bodies 18a and 18b are adhered and connected to the signal line 19 so as to sandwich vertically. Alternatively, a paste-like conductor serving as the signal line 19 may be formed in advance on at least one side of the magnetic bodies 18a and 18b by printing, etc., and the magnetic bodies 18a and 18b are joined together with the signal line 19 disposed inside, and then connected with each other by heat treatment.

A semiconductor package using the chip-type noise filter of the present invention will next be described by taking the foregoing chip-type noise filter 10 as example.

Figure 3:
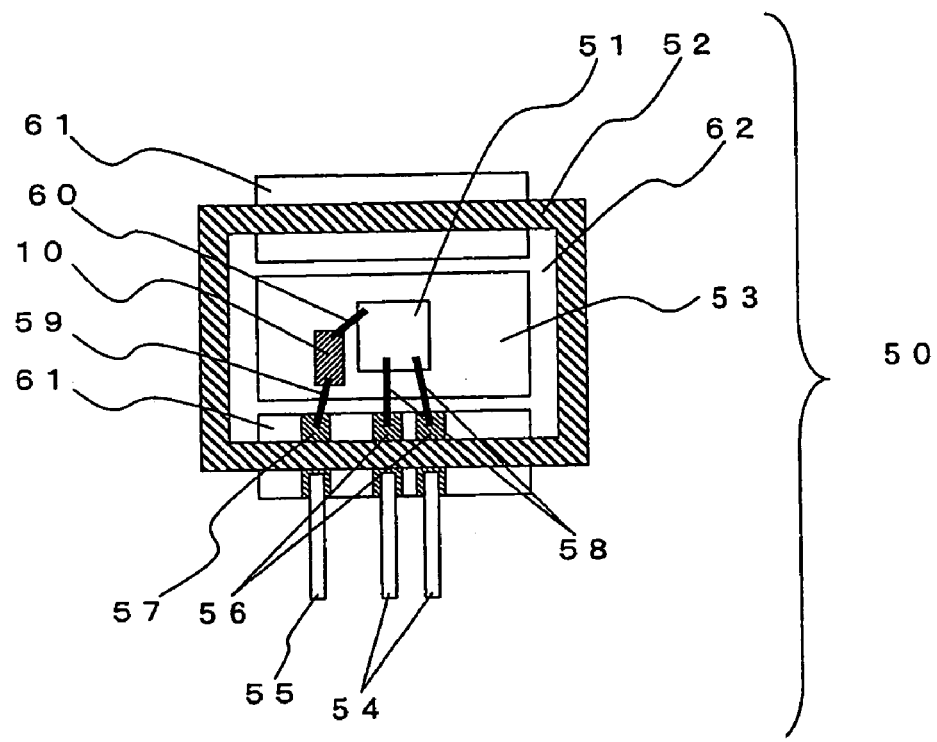
FIG. 3 is a transverse sectional view illustrating a semiconductor package of the present invention.
Figure 4:
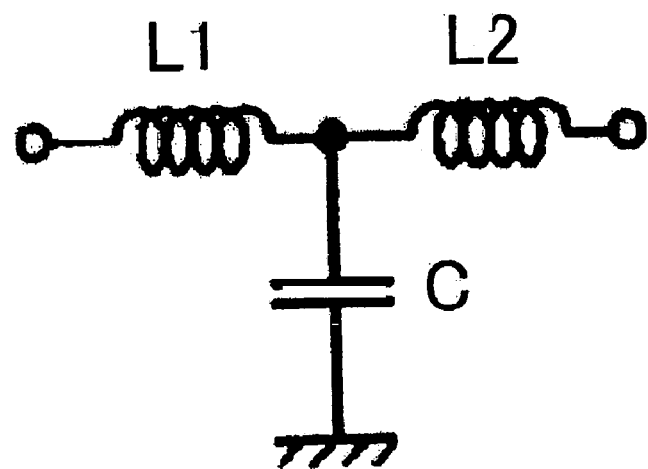
FIG. 4 is an equivalent circuit diagram of a conventional chip-type noise filter.

FIG. 3 is a transverse sectional view illustrating a semiconductor package of the present invention, wherein similar reference numerals indicate the same parts as in FIGS. 1A and 1B. A semiconductor device 51 is composed of Ga—As compound, for example, and fixed on an island pattern disposed on a ceramic substrate 53 by eutectic mounting method.

The input/output of high-frequency signal is connected to the semiconductor device 51 via an external wiring lead 54, an electrode 56 and a bonding wire 58 formed on a package substrate 61.

An external wiring lead 55 for bias voltage input is connected to the chip-type noise filter 10 via an electrode 57 and a bonding wire 59, and further connected to the semiconductor device 51 via a bonding wire 60.

An internal space 62 of the semiconductor package 50 is sealed air-tight by a lid composed of a metal plate (not shown), thereby to protect the semiconductor device 51 that is poor in moisture resistance and gas resistance.

Herein, by arranging the chip-type noise filter 10 of the present invention at the inside of the semiconductor package, high-frequency noise irradiated from the electrode 56 for inputting/outputting high-frequency signal, the bonding wire 61, the semiconductor device 51 and their respective connecting portions is reflected in multiple at the sidewall portions of a package case 52 and the internal space surfaces of the lid (not shown). As a result, the high-frequency noise entering the wiring portion for bias voltage can be absorbed thereby to stabilize the operation of the semiconductor device 51.

Furthermore, since in the chip-type noise filter 10, the magnetic body is a sintered body containing mainly $Fe_2O_3$ and containing NiO in the rest, no outgassing occurs at the temperature rise in the step of manufacturing a package and under operating environment. Accordingly, as compared with the conventional chip-type noise filter using resin and rubber, etc., the occurrence of outgassing can be reduced considerably, thus enabling to improve reliability of the semiconductor device 51.

EXAMPLE

Examples of the present invention will next be described on the basis of the case of using the chip-type noise filter 10 in FIG. 1A. It is understood, however, that the examples are for the purpose of illustration and the invention is not to be regarded as limited to any of the specific materials or condition therein.

First, the magnetic body 11 is prepared in the following manner.

As a starting material, raw material powder of $Fe_2O_3$ and that of NiO were weighed so as to have the ratio as indicated in Table 1. This starting material together with water were put in a ball mill and blended. Then, wet blending was carried out for eight hours to obtain a slurry having a predetermined viscosity.

Subsequently, with a spray drier, this slurry was dried and granulated. With powder pressing method, the obtained granulated powder was formed at a forming pressure of 100 MPa, thereby obtaining a green body.

This green body was then fired in an atmosphere of 1300° C. in the air, thereby obtaining the magnetic body 11.

With thin-film method, a signal line 12, which consists of an underlayer of Ni and a surface layer of Au, is formed on one main surface of the obtained magnetic body 11, and with a dicing machine, this was cut in a predetermined individual shape, thereby obtaining the chip-type noise filter 10.

To verify an optimum range of $Fe_2O_3$ content and that of NiO content in the magnetic body 11, chip-type noise filters using the magnetic bodies 11, which differ from one another in these contents, and the absorbed amount of high-frequency electric signals was verified.

Relating to absorbed amount, a port 1 and a port 2 of a network analyzer were connected via a coaxial cable and a contact probe to both ends of the signal line 12 of the chip-type noise filter 10, and a power transmission factor S21 in the range of 100 MHz to 40 GHz was measured as an absorbed amount.

Evaluation as noise filter is shown in Table 1, wherein symbol "○" indicates good samples whose absorbed amount in 100 MHz is not more than 0.01 dB, and not less than 0.5 dB in 10 GHz or above; symbol "⊙" indicates excellent samples whose absorbed amount in 100 MHz is not more than 0.01 dB, and not less than 2.0 dB in 10 GHz or above; and symbol "X" indicates poor samples whose absorbed amount in 100 MHz is not more than 0.01 dB, and less than 0.5 dB in 10 GHz or above.

Further, as shown in FIG. 3, by brazing with Au—Sn alloy and eutectic mounting method, the chip-type noise filter 10 of the present invention and the semiconductor device 51 were respectively fixed on the ceramic substrate 53, and connected up to the external wiring leads 54 and 55 by the bonding wires 58, 59 and 60. Further, with seam welding method, a lid (not shown) composed of a metal plate was connected to seal air-tight the internal space 62 of the package 52, thereby obtaining the semiconductor package 50.

The obtained semiconductor package 50 was subjected to reliability test at 150° C. for 2000 hours, and the presence and absence of organic gas generated in the internal space of the semiconductor package 50 was measured with gas chromatograph.

Based on the foregoing tests, over-all evaluation of the semiconductor package 50 was made, and the results are shown in Table 1, wherein symbol "X" indicates poor; symbol "○" indicates good; and symbol "⊙" indicates excellent.

In Table 1, symbol "*" accompanied by sample number indicates the samples beyond the scope of the present invention. Comparative example is based on the conventional method, and uses rubber and permalloy, instead of the sintered body of the present invention containing mainly $Fe_2O_3$ and containing NiO in the rest.

0.5 dB. Therefore, they can suitably be used as the chip-type noise filter of the present invention. Semiconductor packages using these samples cause no outgassing during process and under operating environment, thus exhibiting noise absorbability superior to that obtainable using Comparative Example.

On the other hand, Sample Nos. 1 and 10, which are beyond the scope of the present invention, have poor noise absorbability, and the amount of damping to noise in 10 GHz or above is as small as not more than 0.5 dB. Therefore, they cannot be used as the chip-type noise filter 10 of the present invention.

Further, the following advantages are attainable by setting a $Fe_2O_3$ content to the range of 70 to 95 mol %. That is, it is possible of manufacture in the region in which the amount of damping of noise is stable to the change of $Fe_2O_3$ content, so that the control of manufacturing conditions is facilitated, and a stable characteristic as a magnetic body is obtainable. This leads to improvement of yield, and further facilitates the design of a chip-type noise filter.

Additionally, the chip-type noise filter so obtained is applicable to the inside of a semiconductor package in which a semiconductor device, etc. are mounted in a space sealed air-tight, in order to suppress absorption of high-frequency noise. Absence of outgassing during temperature rise avoids deterioration of the semiconductor device, thus enabling to improve reliability of the semiconductor package.

The invention claimed is:

1. A chip noise filter having a signal line of a conductor and a magnetic body disposed so as to adhere to said signal line, said magnetic body comprising a sintered body containing $Fe_2O_3$ as main component and containing NiO in the rest, wherein said magnetic body has a $Fe_2O_3$ content of 70 to 95 mol %.

2. A chip noise filter having a signal line of a conductor and a magnetic body disposed so as to adhere to said signal line, said magnetic body comprising a sintered body con-

TABLE 1

| Sample No. | Component of Magnetic Body | | Noise Absorption Amount of Magnetic Body | | | Evaluation of Property as Noise Filter | Generation of Outgassing | Over-all Evaluation |
|---|---|---|---|---|---|---|---|---|
| | $Fe_2O_3$ (mol %) | NiO (mol %) | Absorbed Amount at 100 MHz (dB) | Absorbed Amount at 10 GHz (dB) | Absorbed Amount at 40 GHz (dB) | | | |
| *1 | 40 | 60 | less than 0.01 | 0.1 | 0.2 | X | No | X |
| 2 | 50 | 45 | less than 0.01 | 0.6 | 1.2 | ○ | No | ○ |
| 3 | 50 | 50 | less than 0.01 | 0.9 | 1.9 | ○ | No | ○ |
| 4 | 60 | 40 | less than 0.01 | 1.8 | 3.5 | ○ | No | ○ |
| 5 | 70 | 25 | less than 0.01 | 2.2 | 4.1 | ⊙ | No | ⊙ |
| 6 | 70 | 30 | less than 0.01 | 2.6 | 6.2 | ⊙ | No | ⊙ |
| 7 | 80 | 14 | less than 0.01 | 2.7 | 6.5 | ⊙ | No | ⊙ |
| 8 | 80 | 20 | less than 0.01 | 2.8 | 6.8 | ⊙ | No | ⊙ |
| 9 | 95 | 5 | less than 0.01 | 2.5 | 6.5 | ⊙ | No | ⊙ |
| *10 | 100 | 0 | less than 0.01 | 0.2 | 0.4 | X | No | X |
| Comparative Example | Rubber + Permalloy | | less than 0.01 | 1.5 | 2.5 | ○ | Yes | X |

Samples indicated as * are out of the scope of this invention.

The followings are apparent from Table 1. In Sample Nos. 2 to 9, which use the chip-type noise filter within the scope of the present invention, damping in 100 MHz is extremely as small as not more than 0.01 dB, and the amount of damping to noise in 10 GHz or above, which is so-called quasi-millimeter wave and millimeter wave, is not less than taining $Fe_2O_3$ as main component and containing NiO in the rest, wherein said magnetic body has a porosity of not more than 1.0%.

3. The chip noise filter according to claims 1 or 2, wherein crystal grain size of said magnetic body has an average value of 1.0 to 100 μm.

4. The chip noise filter according to claims 1 or 2, manufactured by the steps of: preparing a magnetic body containing mainly $Fe_2O_3$ and containing NiO in the rest; forming a signal line of a conductor at said magnetic body; and dividing said magnetic body in a predetermined individual dimension.

5. A method of manufacturing the chip noise filter according to claims 1 or 2, comprising the steps of:

preparing a magnetic body containing $Fe_2O_3$ as main component and containing NiO in the rest;

forming a signal line of a conductor at said magnetic body; and dividing said magnetic body in a predetermined individual dimension.

6. A semiconductor package having the chip noise filter according to claims 1 or 2, disposed at an inner space in which a semiconductor device is sealed air-tight.

* * * * *